(12) United States Patent
Yi et al.

(10) Patent No.: US 6,597,604 B2
(45) Date of Patent: Jul. 22, 2003

(54) FLASH MEMORY CELL ARRAY AND METHOD FOR PROGRAMMING AND ERASING DATA USING THE SAME

(75) Inventors: Sang Bae Yi, Seoul (KR); Jae Seung Choi, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1 day.

(21) Appl. No.: 10/042,239

(22) Filed: Jan. 11, 2002

(65) Prior Publication Data

US 2002/0089877 A1 Jul. 11, 2002

(30) Foreign Application Priority Data

Jan. 11, 2001  (KR) ................................. P2001-0001627

(51) Int. Cl.$^7$ ............................................. G11C 16/04
(52) U.S. Cl. ........................... 365/185.24; 365/185.05; 365/185.18; 365/185.29; 365/185.33
(58) Field of Search ....................... 365/185.24, 185.05, 365/185.18, 185.27, 185.29, 185.33

(56) References Cited

U.S. PATENT DOCUMENTS

| | | | |
|---|---|---|---|
| 4,868,632 A | | 9/1989 | Hayashi et al. |
| 5,457,652 A | * | 10/1995 | Brahmbhatt ........... 365/185.27 |
| 5,687,118 A | * | 11/1997 | Chang ................... 365/185.19 |
| 5,774,400 A | * | 6/1998 | Lancaster et al. ........ 365/185.3 |
| 5,953,254 A | * | 9/1999 | Pourkeramati ......... 365/185.26 |
| 6,060,742 A | * | 5/2000 | Chi et al. .................... 257/316 |
| 6,160,286 A | * | 12/2000 | Chi ............................. 257/315 |
| 6,404,681 B1 | * | 6/2002 | Hirano .................. 365/185.33 |

* cited by examiner

Primary Examiner—Son T. Dinh
(74) Attorney, Agent, or Firm—Birch, Stewart, Kolasch & Birch, LLP

(57) ABSTRACT

A flash memory cell array and a method for programming and erasing data using the same are provided, in which problems related to over-erasing and disturbance are overcome and a cell area per bit is small to obtain high reliability and high packing density. In a flash memory cell array which includes a plurality of flash memory cells arranged in a matrix form, each of the cells including a selection transistor and a memory transistor serially connected with each other, a method for programming data using the flash memory cell array comprising the steps of setting a threshold voltage of the selection transistors at an initial threshold voltage level $V_{T,ref}$ before programming the flash memory cells at N bit data level (level of $2^N$), selecting a cell for programming from the flash memory cells, and setting a threshold voltage level corresponding to the N bit in the selection transistors so that the memory transistor of the selected flash memory cell is programmed at a particular level among the N bit data level.

20 Claims, 4 Drawing Sheets

| MODE | wordline of selected cell | | wordline of cell not selected | | Vs | Vd | VPwell | VNwell |
|---|---|---|---|---|---|---|---|---|
| | Vcg | Vag | Vcg | Vag | | | | |
| program | −8 | +8 | 0 | 0 | HiZ | +8 | 0 | 3.3 |
| program inhibit | −8 | +8 | 0 | 0 | HiZ | 0 | 0 | 3.3 |
| Erase | +8 | 0 | +8 | 0 | −8 | HiZ | −8 | 3.3 |
| Read | 3.3 | 3.3 | 0 | 0 | 0 | 1.5 | 0 | 3.3 |

FIG. 8

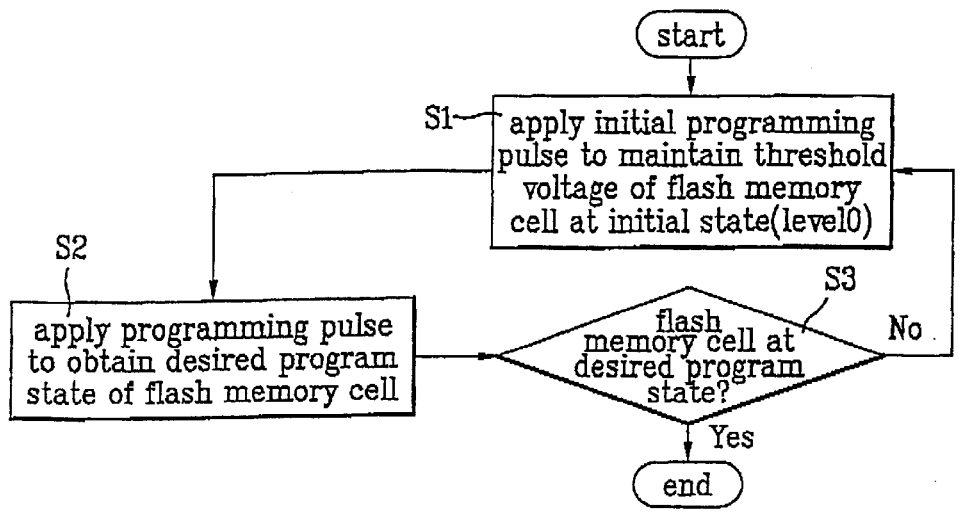

start → S1: apply initial programming pulse to maintain threshold voltage of flash memory cell at initial state(level0) → S2: apply programming pulse to obtain desired program state of flash memory cell → S3: flash memory cell at desired program state? — No → back to S2; Yes → end

FIG. 9

| MODE | selected cell | | Non-selected cell | | $V_s$ | $V_d$ | VPwell | VNwell |
|---|---|---|---|---|---|---|---|---|
| | $V_{w/ls}$ | $V_{s/ls}$ | $V_{w/L}$ | $V_{s/L}$ | | | | |
| Erase ($V_T < V_{T,R1}$) | $-V_{pp4}$ | $-V_{pp3}$ | $-V_{pp4}$ | $-V_{pp3}$ | Vcc | Vcc | Vcc | Vcc |
| $M_A$ — Program ($V_{T,R1} < V_T < V_{T,R2}$) | Vcc | $V_{pp1}$ | 0 | 0 | −Vcc | −Vcc | −Vcc | Vcc |
| Program Inhibit 1 | Vcc | $V_{pp1}$ | 0 | 0 | −Vcc | 0~Vcc | −Vcc | Vcc |
| $M_B$ — Program ($V_{T,R2} < V_T < V_{T,R3}$) | Vcc | $V_{pp2}$ | 0 | 0 | −Vcc | −Vcc | −Vcc | Vcc |
| Program Inhibit 2 | Vcc | $V_{pp2}$ | 0 | 0 | −Vcc | 0~Vcc | −Vcc | Vcc |
| $M_C$ — Program ($V_T > V_{T,R3}$) | $V_{pp4}$ | Vcc | 0 | 0 | HiZ | Vcc | 0 | Vcc |
| Program Inhibit 3 | $V_{pp4}$ | Vcc | 0 | 0 | HiZ | HiZ | 0 | Vcc |
| Read | Vcc | Vcc | 0 | 0 | 0 | Vcc | 0 | Vcc |

FLASH MEMORY CELL ARRAY AND METHOD FOR PROGRAMMING AND ERASING DATA USING THE SAME

RELATED APPLICATION

The present application claims the benefit of Korean Patent Application No. P2001-1627 filed Jan. 11, 2001, which is herein fully incorporated by reference.

BACKGROUND OF THE INVENTION

1. Field of the Invention

The present invention relates to a semiconductor memory device, and more particularly, to a flash memory cell array and a method for programming and erasing the flash memory cell array.

2. Background of the Related Art

The most idealistic memory device from a functional perspective is a nonvolatile ferroelectric memory device, which permits a user to optionally switch a memory state electrically so as to facilitate programming and which retains the memory state even in power offs.

Currently, a nonvolatile ferroelectric memory device in view of process technologies includes a floating gate based memory and a Metal Insulator Semiconductor (MIS) based memory having a layered structure of two or more dielectric films.

The floating gate based memory implements memory characteristics using a potential well. An EPROM-Tunnel OXide (ETOX) structure is widely used as a flash Electrically Erasable Programmable ROM (EEPROM).

On the other hand, the MIS based memory performs its memory function using a trap which exists in a dielectric film bulk, a boundary between dielectric films, and a boundary between a dielectric film and a semiconductor layer. A Metal/polysilicon Oxide Nitride Oxide Semiconductor (MONOS/SONOS) structure is mainly used as a full-featured EEPROM.

A related art flash memory cell based on an MIS and a floating gate and a related art method for programming and erasing data using the same will now be described.

FIG. 1 is a structural sectional view of an MONOS/SONOS memory device of a related art MIS based nonvolatile ferroelectric memory device.

As shown in FIG. 1, a first oxide film 12, a nitride film 13, a second oxide film 14, and a gate electrode 15 are sequentially layered on one region of a P-type semiconductor substrate 11. A source region 16 and a drain region 17 are formed within a surface of the semiconductor substrate 11 at both sides of the layered structure.

The first oxide film 12 is used as a tunneling oxide film while the second oxide film 14 is used as a blocking oxide film.

FIG. 2 is a structural sectional view of a memory device having an ETOX structure of a related art floating gate based nonvolatile ferroelectric semiconductor memory device.

As shown in FIG. 2, a tunneling oxide film 22, a floating gate 23, a dielectric film 24, and a control gate 25 are sequentially layered on one region of a P-type semiconductor substrate 21. A source region 26 and a drain region 27 are formed within a surface of the semiconductor substrate 11 at both sides of the layered structure.

The floating gate 23 formed between the tunneling oxide film 22 and the dielectric film 24 is electrically isolated. The control gate 25 formed on the dielectric film 24 on the floating gate 23 acts to switch a memory state by applying a sufficiently great voltage.

The dielectric film 24 between the control gate 25 and the floating gate 23 is an Inter Polysilicon Dielectric (IPD), and the oxide film formed on the semiconductor substrate 21 is the tunneling oxide film 22.

In case where a memory cell having the aforementioned related art ETOX structure is used as a flash EEPROM, a 1-transistor per 1-cell type and a 2-transistor per 1-cell type are used.

The 1-transistor per 1-cell type has a small unit cell area suitable for high packing density and adopts a Channel Hot Electron (CHE) program mechanism having a high program speed. However, the 1-transistor per 1-cell type has a problem in that reliability deteriorates due to over-erasing and disturbance.

To solve a problem related to over-erasing and disturbance, a flash memory cell of a 2-transistor per 1-cell type has been suggested.

FIG. 3 is a structural sectional view of a related art flash memory cell of a 2-transistor per 1-cell type.

As shown in FIG. 3, a MOS transistor 30a and an ETOX memory cell 30b are serially connected with each other at a constant interval on a semiconductor substrate 31. The MOS transistor 30a is used as a selection transistor while the ETOX memory cell 30b is used as a memory transistor.

The process for fabricating the aforementioned related art flash memory cell of FIG. 3 will now be described. First, a first oxide film 32 is formed on a semiconductor substrate 31, and a first polysilicon layer is formed on the first oxide film 32 by a Chemical Vapor Deposition (CVD) method. The first polysilicon layer is removed selectively by photolithography and etching processes to form a floating gate 33.

Subsequently, a second oxide film is formed over the semiconductor substrate 31, and a second polysilicon layer is formed on the second oxide film. The second oxide film and the second polysilicon layer are removed by photolithography and etching processes to simultaneously form a gate insulation film 34a and a dieletric film 34b made of the second oxide film as well as a gate electrode 35a of the MOS transistor and a control gate 35b of the ETOX memory cell made of the second polysilicon layer.

Impurity ions are implanted into an entire surface of the semiconductor substrate 31 using the gate electrode 35a of the MOS transistor and the control gate 35b of the ETOX memory cell as masks to form source regions 36 and a drain region 37 within a surface of the semiconductor substrate 31. Thus, the MOS transistor 30a and the ETOX memory cell 30b are formed serially connected by the drain region 37 on the semiconductor substrate 31.

A related art method for programming and erasing data using a cell array having a unit cell with the configuration of FIG. 3 will be described below.

FIG. 4 is a table showing an operational voltage of the related art flash memory cell having the structure of FIG. 3.

First, a unit cell for programming is selected from a plurality of flash memory cells.

A voltage of −8V is applied to a wordline of the selected flash memory cell while 8V is applied to a selection line of the selected flash memory cell. High impedance HiZ is applied to a source 36 while 8V is applied to a drain 37. Also, 0V is applied to a P-well (not shown) while 3.3V is applied to an N-well (not shown).

When performing a programming operation of the selected flash memory cell as above, 0V is applied to a drain, i.e., a bitline so as not to perform a programming operation of other flash memory cells operated by receiving signals of the wordline and the selection line of the selected flash memory cell. This is called a program inhibit operation.

In the programming operation and the program inhibit operation, 0V is applied to wordlines and selection lines of the other flash memory cells to which signals of the wordline and the selection line of the selected flash memory cell are not applied.

In a method for erasing data stored in the related art flash memory cells, 8V is applied to all the wordlines, and 0V is applied to all the selection lines. A voltage of −8V is applied to a source while high impedance is applied to a drain (bitline). Also, 0V is applied to a P-well while 3.3V is applied to an N-well.

In a read operation of the related art flash memory cells, 3.3V is respectively applied to a wordline and a selection line of a selected cell. A voltage of 0V is applied to the wordline and selection lines of non-selected cells, a source and a P-well while 1.5V is applied to a drain (bitline).

However, the aforementioned related flash memory cell and the method for programming and erasing data using the same have several problems.

First, the flash memory cell of the 1-transistor per 1-cell type deteriorates reliability due to over-erasing and disturbance. Further, an additional circuit (i.e., the 2-transistor per 1-cell circuit) provided to solve such a problem reduces cell efficiency and results in a complicated design. Moreover, since the flash memory cell of the 2-transistor per 1-cell type has a large cell area per bit, it is difficult to achieve high packing density in related art flash memory cells.

SUMMARY OF THE INVENTION

Accordingly, an object of the invention is to solve at least the above problems and/or disadvantages and to provide at least one or more of the advantages as described hereinafter.

Another object of the present invention is to provide a flash memory cell array, which overcomes problems related to over-erasing and disturbance and has a small cell area per bit to obtain high reliability and high packing density.

Still another object of the present invention is to provide a method for programming and erasing data using the flash memory cell array.

To achieve at least these objects and other advantages in a whole or in part and in accordance with the purpose of the present invention, as embodied and broadly described, a flash memory cell array according to one aspect of the present invention includes: a plurality of flash memory cells arranged in a matrix form with a unit cell consisting of a selection transistor of an SONOS structure and a memory transistor of an ETOX structure serially connected with each other; a plurality of selection lines and wordlines arranged in parallel to respectively apply a driving signal to the selection transistor and the memory transistor of the unit cell; a plurality of bitlines respectively contacted between adjacent memory transistors within the same row and arranged in vertical direction to the selection lines; and common source lines respectively contacted between adjacent selection transistors in each row.

In another aspect, in a flash memory cell array which includes a plurality of flash memory cells arranged in a matrix form with a unit cell consisting of a selection transistor and a memory transistor serially connected with each other, a plurality of selection lines connected to a gate of the selection transistor of the unit cell, a plurality of wordlines connected to a gate of the memory transistor of the unit cell, a plurality of bitlines respectively connected to a drain of the unit cell, common source lines commonly connected to a source of the unit cell, and P and N wells formed below each of the flash memory cells, a method for programming data using the flash memory cell array includes the steps of: setting a threshold voltage of the selection transistors at an initial threshold voltage level $V_{T,ref}$ before programming the flash memory cells at N bit data level (level of $2^N$); selecting a cell for programming among the flash memory cells; and setting a threshold voltage value corresponding to the N bit in the selection transistors so that the memory transistor of the selected flash memory cell is programmed at a constant data value (level) among the N bit data level (level of $2^N$).

In other aspect, in a flash memory cell array which includes a plurality of flash memory cells arranged in a matrix form with a unit cell consisting of a selection transistor and a memory transistor serially connected with each other, a plurality of selection lines connected to a gate of the selection transistor of the unit cell, a plurality of wordlines connected to a gate of the memory transistor of the unit cell, a plurality of bitlines respectively connected to a drain of the unit cell, common source lines commonly connected to a source of the unit cell, and P and N wells formed below each of the flash memory cells, a method for erasing data using the flash memory cell array includes the steps of: applying a first driving voltage −Vpp4 to all the wordlines; applying a second driving voltage −Vpp3 to the selection lines; and applying a power source voltage Vcc to the source, the drain, the N well, and the P well of the respective cells.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 8 is a flow chart showing a method for programming data of a multilevel flash memory cell according to an embodiment of the present invention; and FIG. 9 is a table showing an operational voltage of a multilevel flash memory cell according to an embodiment of the present invention.

DETAILED DESCRIPTION OF PREFERRED EMBODIMENTS

Reference will now be made in detail to the preferred embodiments of the present invention, examples of which are illustrated in the accompanying drawings.

Figure 1:
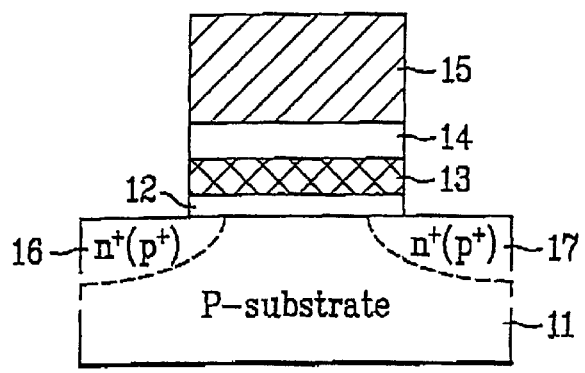
FIG. 1 is a structural sectional view of an MONOS/SONOS memory device of a related art MIS based non-volatile ferroelectric memory device.
Figure 2:
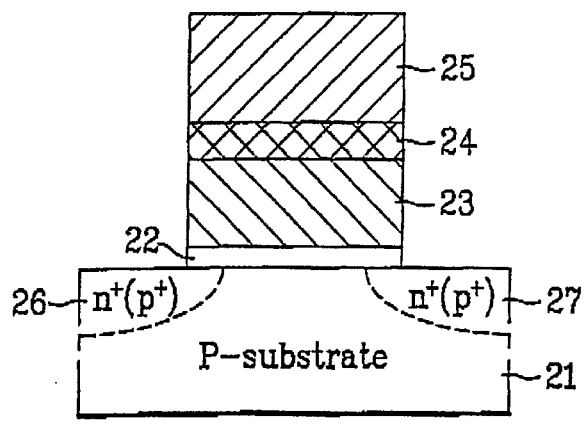
FIG. 2 is a structural sectional view of a memory device having an ETOX structure of a related art floating gate based nonvolatile ferroelectric semiconductor memory device.
Figure 3:
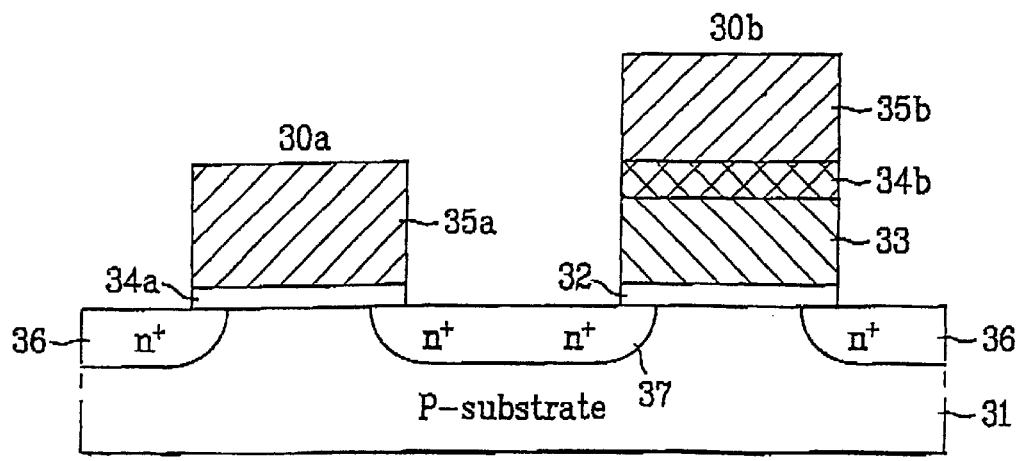
FIG. 3 is a structural sectional view of a related art flash memory cell having a 2-transistor per 1-cell type.
Figures 4, 5:
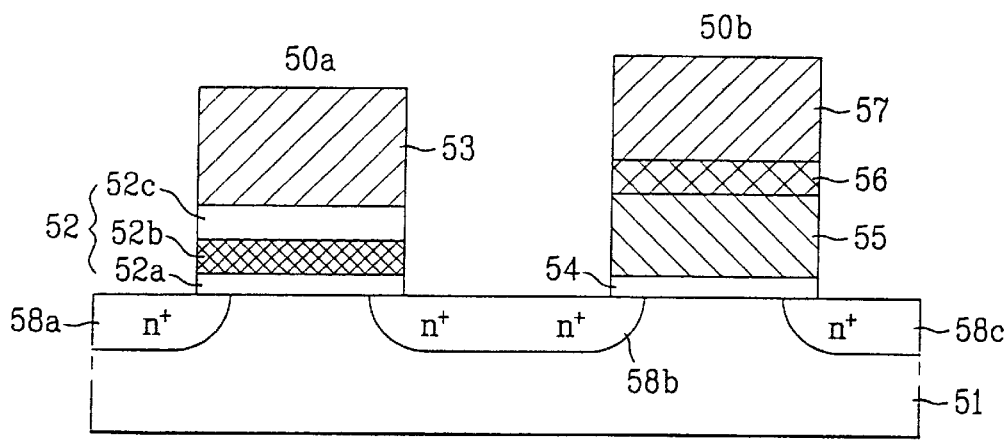
FIG. 4 is a table showing an operational voltage of the related art flash memory cell having the structure of FIG. 3.
FIG. 5 is a structural sectional view of a multilevel flash memory cell according to an embodiment of the present invention for application of a method for programming and erasing data according to the present invention.

FIG. 5 is a structural sectional view of a multilevel flash memory cell according to an embodiment of the present invention for application of a method for programming and erasing data according to an embodiment of the present invention.

As shown in FIG. 5, a flash memory cell according to one embodiment of the present invention includes two transistors per one cell. Here, the two transistors are a selection transistor 50a and a memory transistor 50b.

The selection transistor 50a is a layered structure in which a gate oxide film 52 and a gate electrode 53 are layered on a region of a semiconductor substrate 51 to form an SONOS structure.

The gate oxide film 52 has a three layered structure composed of a tunneling oxide film 52a, a nitride film 52b, and a blocking oxide film 52c.

The memory transistor 50b has a layered structure in which a tunneling oxide film 54, a floating gate 55, a gate oxide film 56, and a control gate 57 are layered on a region of the semiconductor substrate 51 to form an ETOX structure.

Impurity regions 58a, 58b, and 58c are formed within the semiconductor substrate 51 at both sides of the gate electrode 53 of the selection transistor 50a and the control gate 57 of the memory transistor 50b.

At this time, as shown in FIG. 5, the impurity region 58a left of the gate electrode 53 of the selection transistor 50a is a common source, the impurity region 58c right of the control gate 57 of the memory transistor 50b is a common drain, and the impurity region 58b between the gate electrode 53 and the control gate 57 is a node which serially connects the selection transistor 50a with the memory transistor 50b.

If the selective transistor and the memory transistor have an n channel, then a P-well is provided below the flash memory cell. If the selective transistor and the memory transistor have a p channel, then an N-well is provided. The N-well and P-well represent an N-type substrate and a P-type substrate, respectively.

An array of the flash memory cell provided with the aforementioned unit cell according to one embodiment of the present invention will now be described.

Figure 6:
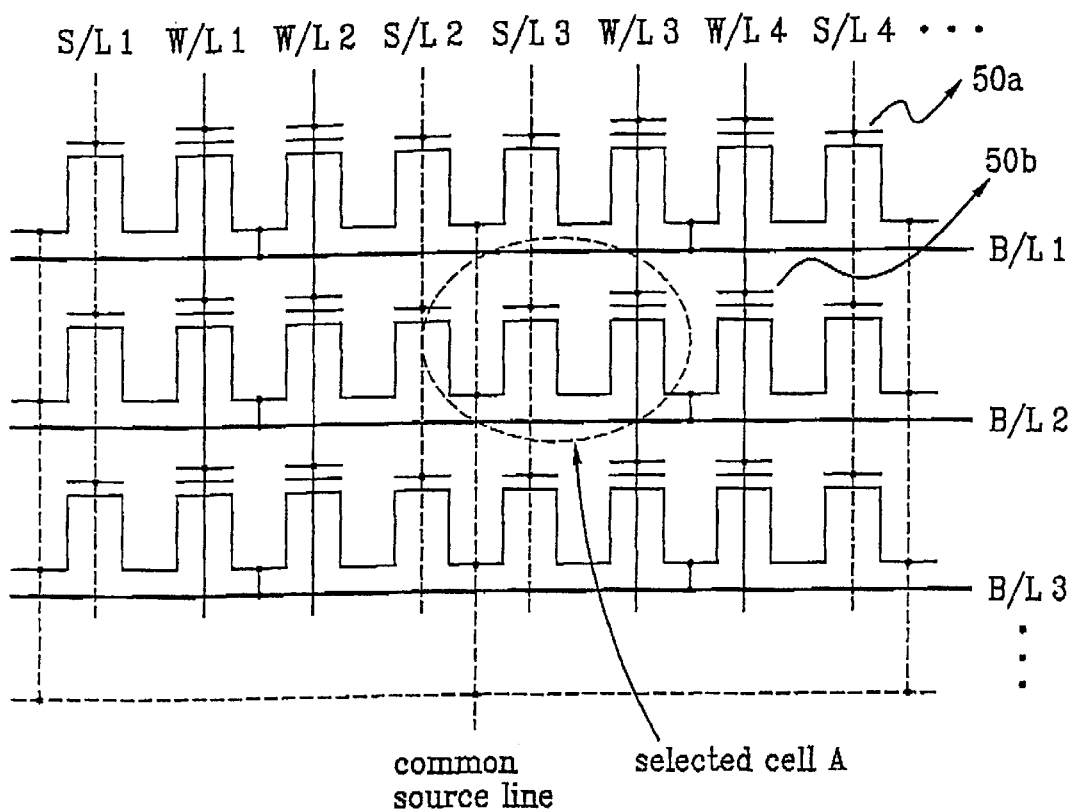
FIG. 6 is a circuit diagram of a multilevel flash memory cell array having the structure of FIG. 5 as a unit cell according to an embodiment of the present invention.

FIG. 6 shows a multilevel flash memory cell array wherein the cells have the structure of FIG. 5.

As shown in FIGS. 5 and 6, each unit cell includes the selection transistor 50a of an SONOS structure and the memory transistor 50b of an ETOX structure. A plurality of such unit cells are arranged in a matrix form to produce a cell array. The respective cells use a source and a drain in common with adjacent cells to compensate for loss of an area.

A plurality of selection lines S/L1, S/L2, S/L3, S/L4, . . . and a plurality of wordlines W/L1, W/L2, W/L3, W/L4, . . . are arranged in parallel to apply an appropriate signal to the gate electrode 53 and the control gate 57 of each cell, respectively.

Here, one selection line S/L and one wordline W/L constitutes one pair.

A plurality of bitlines B/L1, B/L2, B/L3, . . . are arranged perpendicular to the selection lines S/L.

Each unit cell is contacted with the bitlines B/L between memory transistors of adjacent wordlines W/L. Each unit cell is also contacted with a common source line between selection transistors of adjacent selection lines S/L.

A method for implementing a multilevel cell by varying threshold voltages of the selection transistor having an SONOS structure will be described below according to an embodiment of the present invention.

Figure 7:
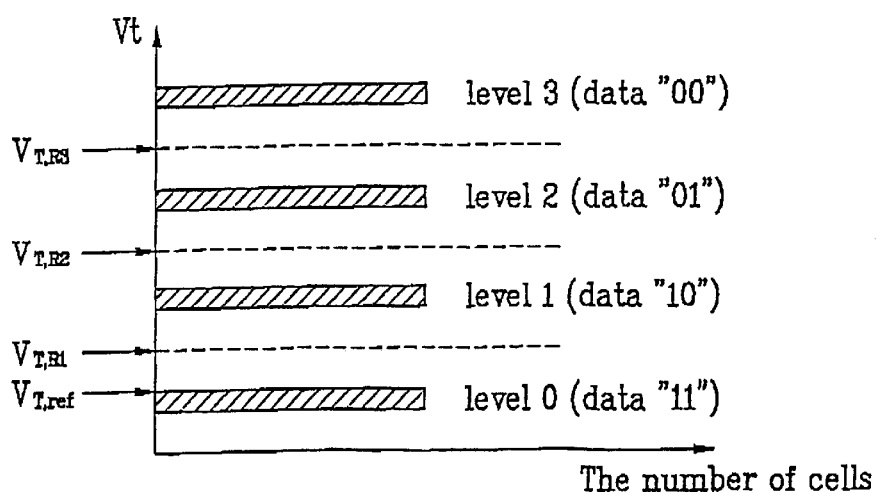
FIG. 7 shows a distribution of threshold voltages of a multilevel flash memory cell according to an embodiment of the present invention.

FIG. 7 shows a distribution of threshold voltages of a multilevel flash memory cell according to an embodiment of the present invention.

For example, to store 2 bit data in the unit cell, as shown in FIG. 7, four levels are required. The four levels are respectively defined by read reference cells having threshold voltages of $V_{T,R1}$, $V_{T,R2}$, and $V_{T,R3}$. In other words, if a threshold voltage $V_T$ of a cell is $V_T < V_{T,R1}$, level 0 (data "11") is defined. If a threshold voltage $V_T$ of the cell is $V_{T,R1} < V_T < V_{T,R2}$, level 1 (data "10") is defined. If a threshold voltage $V_T$ of the cell is $V_{T,R2} < V_T < V_{T,R3}$, level 2 (data "01") is defined. If a threshold voltage $V_T$ of the cell is $V_T > V_{T,R3}$, level 3 (data "00") is defined. Since a reference threshold voltage $V_{T,R1}$, $V_{T,R2}$, or $V_{T,R3}$ for determining each level has a specific voltage value, a margin between respective levels is wide.

Next, a method for programming and erasing data of the flash memory cell provided with the aforementioned multilevel cell will be described according to an embodiment of the present invention.

A method for programming data will be first described referring to FIGS. 7 and 8. FIG. 8 is a flowchart illustrating process steps for a method of programming data of a multilevel flash memory cell according to one embodiment of the present invention.

As shown in FIGS. 7 and 8, the selection transistor 50a and the memory transistor 50b of a selected cell, (i.e., the threshold voltage of a selected flash memory cell) are set at an initial state (level 0) in Step S1. Afterwards, it is determined whether the threshold of the selected cell voltage is at an initial state (level 0) to verify the state of the cell. If the threshold voltage is set at the initial state, the operation for programming a data value of a desired level in the desired memory transistor is performed, which will be discussed below in more detail. But, if the threshold voltage is not at the initial state, then the threshold voltage is set to be at the initial state. Here, the threshold voltage $V_T$ of the initial state is defined as $V_{T,ref}$.

Then, appropriate selection line S/L, wordline W/L, and bitline B/L are selected and programming pulses are applied to the desired cell (selected cell) to begin programming of the desired cell in Step S2. If it is determined at Step S3 that the selected flash memory cell is at the desired program state, then the process ends. But if it is not, then the process returns to Step S1.

As an example, as shown in FIG. 6, a particular flash memory cell A (marked by a dotted line) operated by receiving signals of the selection line S/L3, the wordline W/L3, and the bitline B/L2 is selected and programmed. A process for programming the selected flash memory cell A at multilevel will be described below referring to FIG. 9. In a preferred embodiment, in FIG. 9, Vpp4 and Vpp3 equal approximately 14V, Vpp2 equals about 12V, Vpp1 equals about 10V, and HiZ represents a floating state. For the voltages applied to a drain (Vd), a source (Vs), a P-well (VPwell) and an N-well (VNwell), Vcc preferably ranges from about 1.8 to 3.3V.

First, to maintain the flash memory cells at low level 0 (i.e., to erase the cells), as shown in FIG. 9, a first driving voltage −Vpp4 is applied to all the wordlines W/L, a second driving voltage −Vpp3 is applied to all the selection lines S/L, and a power source voltage Vcc is applied to the common source 58a, the common drain (bitline) 58c, the P-well, and the N-well.

A process for programming the selected flash memory cell A to maintain it at level 1 where the threshold voltage of the cell A is $V_{T,R1} < V_T < V_{T,R2}$ (as shown in FIG. 7) will be described. As shown in FIGS. 6 and 9, in Mode $M_A$, the power source voltage Vcc is applied to the wordline W/L3 of the selected flash memory cell A, a third driving voltage Vpp1 is applied to the selection line S/L3 of the cell A, a negative power source voltage −Vcc is applied to the source 58a, the drain 58c, and the P-well, and the power source voltage Vcc is applied to the N-well. A voltage of 0V is applied to the wordlines and selection lines of non-selected cells. This constitutes a first step for programming.

During the first step, voltages as shown in Program Inhibit 1 section of FIG. 9 are applied to the non-selected flash memory cells. That is, 0V is applied to all other wordlines and selected lines except for the wordline W/L3 and the selection line S/L3, the power source voltage −Vcc is applied to the source and the P-well, a voltage between 0V and Vcc is applied to the drain, and the power source voltage Vcc is applied to the N-well, so as to inhibit programming of non-selected flash memory cells. This constitutes a second step for programming.

A process for programming the selected flash memory cell A to be maintained at level 2 (data 01) where the threshold voltage is $V_{T,R2} < V_T < V_{T,R3}$ as shown in FIG. 7 will be described. As shown in FIGS. 6 and 9, in Mode $M_B$, the power source voltage Vcc is applied to the wordline W/L3 of the selected flash memory cell A, a fourth driving voltage Vpp2 is applied to the selection line S/L3 of the cell A, a negative power source voltage −Vcc is applied to the source, the drain, and the P-well, and the power source voltage Vcc is applied to the N-well. This constitutes a third step for programming.

During the third step, voltages as shown in Program Inhibit 2 section of FIG. 9 are applied to the other (non-selected) flash memory cells. Specifically, 0V is applied to the other wordlines and selection lines (bitlines) except for the wordline W/L3 and the selection line S/L3, the negative power source voltage −Vcc is applied to the source and the P-well, a voltage between 0V and Vcc is applied to the drain, and the power source voltage Vcc is applied to the N-well, so as to inhibit programming of the other flash memory cells connected to the wordline W/L3 and the selection line S/L3 but not selected. This constitutes a fourth step for programming.

When performing the third and fourth steps, 0V is applied to all other wordlines and selection lines except for the wordline W/L3 and the selection line S/L3, so as to inhibit programming of the other flash memory cells not connected to the wordline W/L3 and the selection line S/L3.

A process for programming the selected flash memory cell A to be maintained at level 3 (data 00) where the threshold voltage is $V_{T,R3} < V_T$ (as shown in FIG. 7) will be described. As shown in FIGS. 6 and 9, in Mode $M_C$, the first driving voltage Vpp4 is applied to the wordline W/L3 of the selected flash memory cell A, the power source voltage Vcc is applied to the selection line S/L3 of the selected cell A, high impedance HiZ is applied to the source, the power source voltage Vcc is applied to the drain and the N-well, and 0V is applied to the P-well. This constitutes a fifth step for programming.

During the fifth step, voltages as shown in Program Inhibit 3 section of FIG. 9 are applied to the non-selected flash memory cells. Specifically, 0V is applied to all other wordlines and selection lines except for the wordline W/L3 and the selection line S/L3, high impedance is applied to the source and the drain, 0V is applied to the P-well, and the power source voltage Vcc is applied to the N-well, so as to inhibit programming of the other flash memory cells connected to the wordline W/L3 and the selection line S/L3 but not selected. This constitutes a sixth step for programming.

When performing the fifth and sixth steps, 0V is applied to all other wordlines and selection lines except for the wordline W/L3 and the selection line S/L3 of the selected cell A, so as to inhibit programming of the other flash memory cells not connected to the wordline W/L3 and the selection line S/L3.

The bias conditions described above are applied to the wordlines, the selection lines, the drain (bitline), the source, and the wells, so that the programming operation is performed in the flash memory cell array according to an embodiment of the present invention.

A method for erasing data, i.e., bias conditions, of the flash memory cell array will now be described according to an embodiment of the present invention. In this method, a plurality of flash memory cells are all erased at one time by Fowler-Nordheim tunneling through an entire surface of a channel, without selecting any particular cells.

Particular, as shown in FIGS. 6, 7, and 9, the first driving voltage −Vpp4 is applied to all the wordlines, the second driving voltage −Vpp3 is applied to all the selection lines, and the power source voltage Vcc is applied to the source, the drain, the N-well, and the P-well. This erasing operation has the same effect as programming the threshold voltage of the cells to be at the initial state where $V_T < V_{T,R1}$.

In addition, the operation for reading data of the selected flash memory cell A is performed in such a manner that the power source voltage Vcc is applied to the wordline W/L3, the selection line S/L3, the drain, and the N-well while 0V is applied to the source and the P-well.

As aforementioned, the flash memory cell array and the method for programming and erasing data using the same according to the embodiments of the present invention have many advantages including the following.

First, since the programming and erasing operation is performed in the unit cell comprising two transistors per one cell, using the multilevel threshold technology, problems related to over-erasing and disturbance do not occur. Also, it is possible to provide a flash memory cell having a small cell area per bit to obtain high reliability and high packing density.

Second, since the selection transistor of a memory cell has an SONOS structure, the user can electrically control the threshold voltage of the selection transistor, thereby easily obtaining design and process margins.

Third, since the existing CMOS process can be applied to the manufacture of the memory cell, mass production for the embedded product as well as the stand-alone product is possible.

Fourth, the memory cell and method improve endurance during the programming and erasing operation.

Finally, the threshold voltages of the program are each distributed in a narrow region. Consequently, it is possible to increase the number of levels and facilitate discrimination among respective levels. Thus, the present invention provides a flash memory device which does not require a separate sensing amplifier.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A flash memory cell array comprising:
   a plurality of flash memory cells arranged in a matrix form, each of the cells including a selection transistor of an SONOS structure and a memory transistor of an ETOX structure serially connected with each other.

2. The flash memory cell array of claim 1, wherein the selection transistor includes:
   a tunneling oxide film, a nitride film, and a blocking oxide film sequentially layered on a semiconductor substrate;
   a gate electrode formed on the blocking oxide film; and
   an impurity diffusion region formed in the semiconductor substrate at sides of the gate electrode.

3. The flash memory cell array of claim 1, wherein the memory transistor includes:
   a tunneling oxide film formed on a semiconductor substrate;
   a floating gate formed on the tunneling oxide film;
   a dielectric film formed on the floating gate; and
   a control gate formed on the dielectric film.

4. The flash memory cell array of claim 1, further comprising:
   a plurality of selection lines and wordlines arranged in parallel to respectively apply a driving signal to the selection transistor and the memory transistor of at least one of the cells; and
   a plurality of bitlines disposed between adjacent memory transistors of the cells across the selection lines.

5. The flash memory cell array of claim 4, further comprising:
   a plurality of common source lines respectively contacted between adjacent selection transistors of the cells.

6. In a flash memory cell array which includes a plurality of flash memory cells arranged in a matrix form, each of the cells including a selection transistor and a memory transistor serially connected with each other, a method for programming data using the flash memory cell array, comprising the steps of:
   setting a threshold voltage of the selection transistors at an initial threshold voltage level $V_{T,ref}$ before programming the flash memory cells at N bit data level (level of $2^N$);
   selecting a cell for programming from the flash memory cells; and
   setting a threshold voltage level corresponding to the N bit in the selection transistors so that the memory transistor of the selected flash memory cell is programmed at a particular level among the N bit data levels.

7. The method of claim 6, wherein, in the step of setting the threshold value, if the N bit is 2 bits and there are levels 0~3, then the threshold voltage level ($V_T$) corresponding to the level 0 is smaller than a first reference voltage $V_{T,R1}$ ($V_T<V_{T,R1}$), the threshold voltage $V_T$ corresponding to the level 1 is greater than the first reference threshold voltage $V_{T,R1}$ and less than a second reference threshold voltage $V_{T,R2}$ ($V_{T,R1}<V_T<V_{T,R2}$), the threshold voltage level $V_T$ corresponding to the level 2 is greater than the second reference threshold voltage $V_{T,R2}$ and less than a third reference threshold voltage $V_{T,R3}$ ($V_{T,R2}<V_T<V_{T,R3}$), and the threshold voltage $V_T$ corresponding to the level 3 is greater than the third reference threshold voltage $V_{T,R3}$ ($V_T>V_{T,R3}$).

8. The method of claim 6, wherein the $2^N$ level is divided into levels 0~3 when the N bit is 2 bits, the level 0 corresponding to data "11", the level 1 corresponding to data "10", the level 2 corresponding to data "01", and the level 3 corresponding to data "00".

9. The method of claim 8, wherein a first driving voltage −Vpp4 is applied to a wordline line of the selected flash memory cell, a second driving voltage −Vpp3 is applied to a selection line of the selected flash memory cell, and a power source voltage Vcc is applied to a source, a drain, a P-well, and an N-well, when the selected flash memory cell is programmed at the level 0.

10. The method of claim 8, wherein a power source voltage Vcc is applied to a wordline line of the selected flash memory cell, a third driving voltage Vpp1 is applied to a selection line of the selected flash memory cell, a negative power source voltage −Vcc is applied to a source, a drain (bitline), and a P-well, and the power source voltage Vcc is applied to an N-well when the selected flash memory cell is programmed at the level 1.

11. The method of claim 10, wherein a negative power source −Vcc is applied to a source and a P-well of non-selected cells connected to the same wordline and selection line as the selected flash memory cell, a voltage between 0V and Vcc is applied to a drain, and the power source voltage Vcc is applied to an N-well.

12. The method of claim 10, wherein 0V is applied to wordlines and selection lines of non-selected flash memory cells.

13. The method of claim 8, wherein a power source voltage Vcc is applied to a wordline line of the selected flash memory cell, a fourth driving voltage Vpp2 is applied to a selection line of the selected flash memory cell, a negative power source voltage −Vcc is applied to a source, a drain, and a P-well, and the power source voltage Vcc is applied to an N-well, when the selected flash memory cell is programmed at the level 2.

14. The method of claim 13, wherein a negative power source −Vcc is applied to a source and a P-well of non-selected cells connected to the same wordline and selection line as the selected flash memory cell, a voltage between 0V and Vcc is applied to a drain, and the power source voltage Vcc is applied to an N-well.

15. The method of claim 13, wherein 0V is applied to wordlines and selection lines of non-selected flash memory cells.

16. The method of claim 8, wherein a first driving voltage Vpp4 is applied to a wordline line of the selected cell, a power source voltage Vcc is applied to a selection line of the selected cell, a drain, and an N-well, high impedance is applied to a source, and 0V is applied to a P-well, when the selected flash memory cell is programmed at the level 3.

17. The method of claim 16, wherein high impedance is applied to a source and a drain of non-selected cells connected to the same wordline and selection line as the selected flash memory cell, 0V is applied to a P-well, and the power source voltage Vcc is applied to an N-well.

18. The method of claim 16, wherein 0V is applied to wordlines and selection lines of cells not connected to the wordline and selection line of the selected flash memory cell.

19. In a flash memory cell array which includes a plurality of flash memory cells arranged in a matrix, each of the cells including a selection transistor and a memory transistor serially connected with each other, a method for erasing data using the flash memory cell array comprising the steps of:

applying a first driving voltage to wordlines of the cells;

applying a second driving voltage to selection lines of the cells; and applying a power source voltage Vcc to a source, a drain, an N-well, and a P-well of the cells.

20. The method of claim 19, wherein the first driving voltage is about −Vpp4 and the second driving voltage is about −Vpp3.

* * * * *